(12) United States Patent
Bai et al.

(10) Patent No.: US 10,014,329 B2
(45) Date of Patent: Jul. 3, 2018

(54) ARRAY SUBSTRATE WITH THIN FILM TRANSISTOR AND METHOD OF MANUFACTURING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Xiangqian Ding, Beijing (CN); Yao Liu, Beijing (CN); Liangliang Li, Beijing (CN); Zongjie Guo, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 26 days.

(21) Appl. No.: 14/436,843

(22) PCT Filed: Sep. 11, 2014

(86) PCT No.: PCT/CN2014/086301
§ 371 (c)(1),
(2) Date: Apr. 17, 2015

(87) PCT Pub. No.: WO2015/149482
PCT Pub. Date: Oct. 8, 2015

(65) Prior Publication Data
US 2016/0254289 A1    Sep. 1, 2016

(30) Foreign Application Priority Data

Mar. 31, 2014   (CN) .......................... 2014 1 0126538

(51) Int. Cl.
*H01L 27/12* (2006.01)
*H01L 29/66* (2006.01)
(Continued)

(52) U.S. Cl.
CPC ........ *H01L 27/1248* (2013.01); *H01L 27/124* (2013.01); *H01L 27/127* (2013.01); *H01L 27/1288* (2013.01)

(58) Field of Classification Search
CPC . H01L 27/1248; H01L 27/124; H01L 27/127; H01L 27/1288; H01L 27/1214;
(Continued)

(56) References Cited

U.S. PATENT DOCUMENTS

2002/0180901 A1* 12/2002 Kim .................... G02F 1/13458
                                                      349/43
2006/0091391 A1    5/2006 Lee et al.
(Continued)

FOREIGN PATENT DOCUMENTS

CN      101034262 A     9/2007
CN      101908537 A     12/2010
(Continued)

OTHER PUBLICATIONS

Dec. 31, 2014—(WO)—International Search Report and Written Opinion PCT/CN2014/086301 English Tran.
(Continued)

*Primary Examiner* — Didarul Mazumder
(74) *Attorney, Agent, or Firm* — Banner & Witcoff, Ltd.

(57) ABSTRACT

An array substrate and manufacturing method thereof and display device are provided. The method of manufacturing the array substrate includes forming a pattern including a gate electrode, a gate line, a common electrode line and a gate insulating layer on a substrate; forming a pattern including a data line, a source electrode, a drain electrode and an active layer; forming a pattern including an insulating interlayer over the pattern of the source electrode, the drain electrode and the active layer; forming a pattern including a first transparent electrode over the insulating interlayer; forming a pattern including a passivation layer over the first transparent electrode; and forming a pattern including a
(Continued)

second transparent electrode over the passivation layer. The method can efficiently prevent the ITO process polluting the TFT channel.

6 Claims, 5 Drawing Sheets

(51) Int. Cl.
*H01L 29/78* (2006.01)
*G02F 1/13* (2006.01)

(58) Field of Classification Search
CPC ............... H01L 27/12; H01L 29/66757; H01L 29/78621; G02F 1/13454
USPC ..... 257/72; 438/48, 128, 149, 151, 157, 283
See application file for complete search history.

(56) References Cited

U.S. PATENT DOCUMENTS

| | | | | |
|---|---|---|---|---|
| 2009/0065771 | A1* | 3/2009 | Iwasaki | H01L 29/78618 257/43 |
| 2011/0074663 | A1* | 3/2011 | Zhou | H01L 27/1288 345/92 |
| 2012/0135570 | A1* | 5/2012 | Song | H01L 27/1288 438/158 |
| 2012/0142128 | A1 | 6/2012 | Kwon | |
| 2013/0214412 | A1 | 8/2013 | Mori | |
| 2014/0027759 | A1* | 1/2014 | Ahn | H01L 29/7869 257/43 |
| 2014/0159034 | A1* | 6/2014 | Yang | H01L 27/1296 257/43 |
| 2014/0176894 | A1* | 6/2014 | Park | G02F 1/134363 349/143 |

FOREIGN PATENT DOCUMENTS

| | | |
|---|---|---|
| CN | 102244034 A | 11/2011 |
| CN | 102707523 A | 10/2012 |
| CN | 103579219 A | 2/2014 |
| CN | 103681488 A | 3/2014 |
| CN | 103928400 A | 7/2014 |

OTHER PUBLICATIONS

Jan. 26, 2016—(CN) Office Action App No. 201410126538.7.
May 27, 2016—(CN)—Second Office Action Appn 201410126538.7 with English Tran.

* cited by examiner

ARRAY SUBSTRATE WITH THIN FILM TRANSISTOR AND METHOD OF MANUFACTURING THE SAME

The application is a U.S. National Phase Entry of International Application No. PCT/CN2014/086301 filed on Sep. 11, 2014, designating the United States of America and claiming priority to Chinese Patent Application No. 201410126538.7 filed on Mar. 31, 2014. The present application claims priority to and the benefit of the above-identified applications and the above-identified applications are incorporated by reference herein in their entirety.

TECHNICAL FIELD

Embodiments of the present disclosure relate to an array substrate and a manufacturing method thereof, and a display device.

BACKGROUND

Advanced Super Dimension Switch (ADS) display mode is used widely due to superior display quality, and has become important global industry technical standards, while high aperture ratio ADS (H-ADS) is one of the most advanced technologies.

SUMMARY

At least one embodiment of the present disclosure provides a method of manufacturing an array substrate, the method comprises: forming a pattern including a gate electrode, a gate line, a common electrode line and a gate insulating layer on a substrate; forming a pattern including a data line, a source electrode, a drain electrode and an active layer; forming a pattern including an insulating interlayer over the pattern of the source electrode, the drain electrode and the active layer; forming a pattern including a first transparent electrode over the insulating interlayer; forming a pattern including a passivation layer over the first transparent electrode; and forming a pattern including a second transparent electrode over the passivation layer.

In an example, forming of the pattern of the insulating interlayer and the pattern of the first transparent electrode comprises: applying photoresist on the insulating interlayer; exposing and developing the photoresist by using a double-tone mask to remove a portion of the photoresist corresponding to a region where the pattern of the drain electrode is located; partially remain a portion of the photoresist corresponding to a region where the pattern of the first transparent electrode is located, fully remain portions of the photoresist of other regions; etching the exposed insulating interlayer to form a first via hole so as to expose the drain electrode; processing the photoresist in an ash process to remove a portion of the photoresist corresponding to the region where the pattern of the first transparent electrode is located, and remain portions of the photoresist outside of the regions where the first transparent electrode and the first via hole are located; forming a first transparent conducting thin film and removing the remained portions of the photoresist and the first transparent conducting thin film thereon to form a first transparent electrode, wherein the first transparent electrode is connected with the drain electrode through the first via hole.

In an example, in the procedure of forming the pattern including the second transparent electrode over the passivation layer, a second via hole is formed in a region of the passivation layer, which corresponds to a region where the pattern of the common electrode line is located; a second transparent electrode is formed so that the second transparent electrode is connected with the common electrode line through the second via hole.

In an example, forming the pattern of the insulating interlayer and the pattern of the first transparent electrode comprise: applying photoresist on the insulating interlayer; exposing and developing the photoresist by using a double-tone mask to remove a portion of the photoresist corresponding to the region where the pattern of the common electrode line is located, and partially remain a portion of the photoresist corresponding to the region where the pattern of the first transparent electrode is located, fully remain portions of the photoresist of the other regions; etching the exposed insulating interlayer to form the first via hole so as to expose the common electrode line; processing the photoresist by an ash process to remove a portion of the photoresist corresponding to the region where the pattern of the first transparent electrode is located, and remain a portion of the photoresist outside of the regions where the first transparent electrode and the first via hole are located; forming the first transparent conducting thin film and removing the remained portions of the photoresist and the first transparent conducting thin film thereon to form the first transparent electrode, wherein the first transparent electrode is connected with the common electrode line through the first via hole.

In an example, in the procedure of forming the pattern including the second transparent electrode over the passivation layer, a second via hole is formed in a region of the passivation layer, which corresponds to a region where the drain electrode is located; and a second transparent electrode is formed so that the second transparent electrode is connected with the drain electrode line through the second via hole.

In an example, the method further comprises performing a hydrogen plasma process to a channel region formed between the source electrode and the drain electrode before forming the pattern including the insulating interlayer over the pattern of the source electrode, the drain electrode and the active layer.

In an example, forming of the pattern of the insulating interlayer and the pattern of the first transparent electrode comprises: applying photoresist on the insulating interlayer; exposing and developing the photoresist by using a mask to remove portions of the photoresist corresponding to regions where a part of the pattern of the drain pattern and the pattern of the first transparent electrode are located, fully remain portions of the photoresist of the other regions; etching all of the exposed insulating interlayer; forming a first transparent conducting thin film and removing the remained portions of the photoresist and the first transparent conducting thin film thereon to form the first transparent electrode.

In an example, a via hole is formed in a region corresponding to a region where the pattern of the common electrode line is located, which passes through the passivation layer and the insulating interlayer; and the second transparent electrode is connected with the common electrode line through the via hole.

In an example, the first transparent electrode is located between the gate insulating layer, the drain electrode and the passivation layer.

In an example, a hydrogen plasma process is performed to a channel region formed between the source electrode and the drain electrode before the pattern including the insulating interlayer over the pattern of the source electrode, the drain electrode and the active layer is formed.

At least one embodiment of the present disclosure also provides an array substrate, the array substrate comprises a gate line, a data line, a common electrode line, a thin film transistor comprising a source electrode, a drain electrode and an active layer, a first transparent electrode formed on a substrate; a passivation layer and a second transparent electrode formed over the first transparent electrode; an insulating interlayer between the active layer of the thin film transistor and the layer where the first transparent electrode is located; a first via hole is formed in the insulating interlayer; and a second via hole is formed in the passivation layer; wherein the first transparent electrode is connected with the drain electrode of the thin film transistor through the first via hole, the second transparent electrode is connected with the common electrode line through the second via hole; or the first transparent electrode is connected with the common electrode line through the first via hole, the second transparent electrode is connected with the drain electrode of the thin film transistor through the second via hole.

In an example, the insulating interlayer is made of silicon nitride.

In an example, the insulating interlayer has a thickness of 50 Å-500 Å.

At least one embodiment of the present disclosure also provides an array substrate, the array substrate comprises a gate line, a data line, a common electrode line, a thin film transistor comprising a source electrode, a drain electrode and an active layer, a first transparent electrode formed on a substrate; a passivation layer and a second transparent electrode formed over the first transparent electrode; an insulating interlayer between the active layer of the thin film transistor and the layer where the first transparent electrode is located; a via hole is formed over the common electrode line, which passes through the insulating interlayer and the passivation layer; wherein the first transparent electrode is located between the gate insulating layer, the drain electrode and the passivation layer, and is connected with the drain electrode, the second transparent electrode is connected with the common electrode line through the via hole.

In an example, the insulating interlayer is made of silicon nitride, and the insulating interlayer has a thickness of 50 Å-500 Å.

At least one embodiment of the present disclosure provides a display device, the display device comprises any one of the array substrates.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which:

FIG. 2b is a schematic structural view of the substrate having an insulating interlayer on the basis of FIG. 2a;

DETAILED DESCRIPTION

Figure 1A:
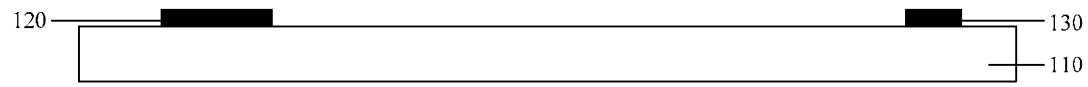
FIG. 1a-1e are flow diagrams of forming various features of an array substrate in a method of manufacturing the array substrate.
Figure 1B:
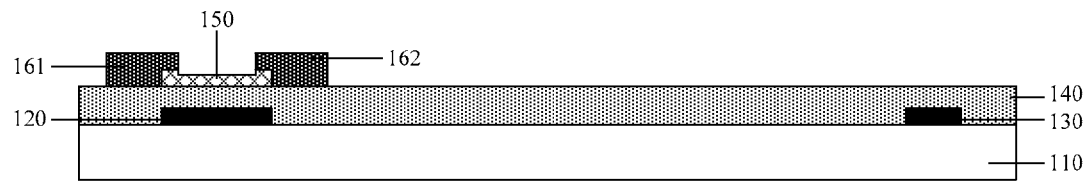
Figure 1C:
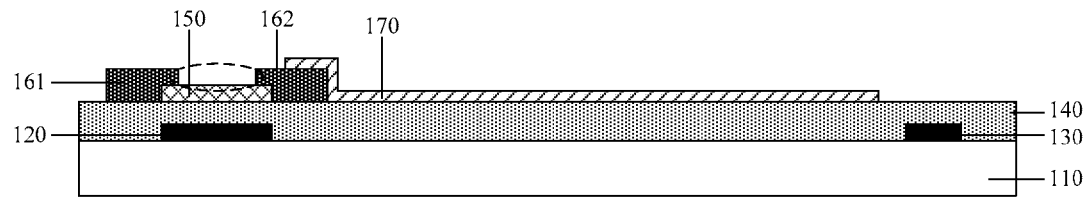
Figure 1D:
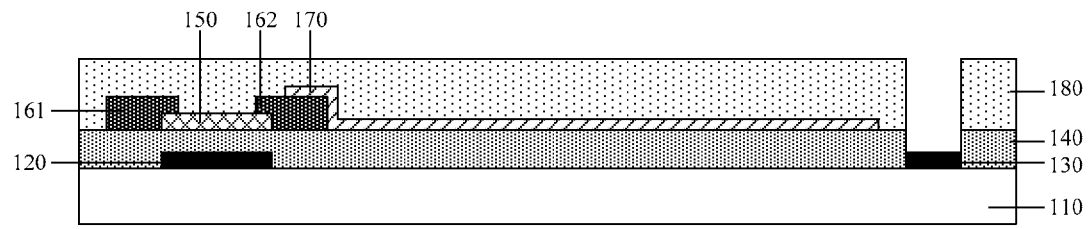
Figure 1E:
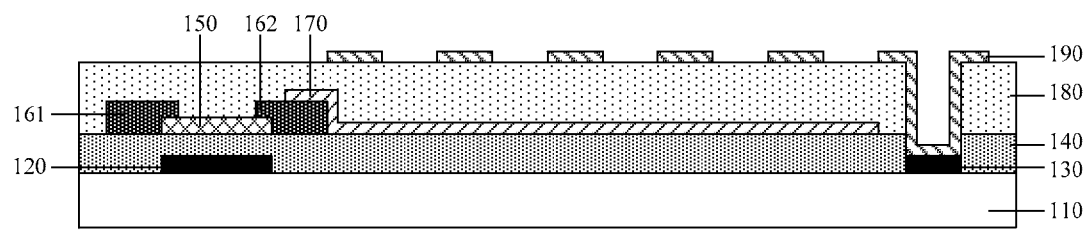

The technical solutions of the embodiments of the present disclosure will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

The flow diagram of manufacturing a thin film transistor (TFT) array substrate in a H-ADS display mode is shown as FIGS. 1a-1e. A gate electrode 120, a gate line (not shown in the Figures) and a common electrode line 130 are formed on the substrate 110 (one mask process); a gate insulating layer 140 is formed; an active layer 150 is formed; a data line (not shown in Figures), a source electrode 161 and a drain electrode 162 are formed (one mask process); a first transparent electrode 170 is formed (one mask process); a passivation layer 180 and a via hole therein are formed (one mask process); and a second transparent electrode 190 is formed (one mask process).

In the process of manufacturing the array substrate, the inventors notice that the following problems. Referring to FIGS. 1a-1e, when the process of forming the first transparent electrode 170 is performed, the process of manufacturing the source electrode 161 and the drain electrode 162 is completed, and all the part of the TFT channel (shown as dotted box in FIG. 1c) is exposed externally. The material of the first transparent electrode 170 is usually indium tin oxide (ITO), which may introduce impurities to pollute the TFT channel when the deposition is performed; meanwhile, the remained ITO etching liquid and the ITO remained within the channel can also pollute the TFT channel. The TFT channel decides the property of the TFT, and the pollution of the TFT channel would cause the property of TFT abnormal and affect the product property.

Furthermore, although the TFT channel is processed by using hydrogen plasma ($H_2$ Plasma) to decrease the leakage current of the off-current/leakage current $I_{off}$ of the TFT and improve product quality before the passivation layer 180 is deposited, the hydrogen plasma would cause the first transparent electrode ITO to be reduced and thereby to produce haze mura. Therefore the $H_2$ plasma processing is usually not used before the passivation layer 180 is deposited (PVX Dep) in the process of manufacturing the TFT array substrate in a H-ADS display mode, it causes the $I_{off}$ of the TFT to be larger and thereby to affect the product quality.

As shown in FIGS. 2a-2g, the method of manufacturing the array substrate according to one embodiment of the present disclosure includes the following steps.

Figure 2A:
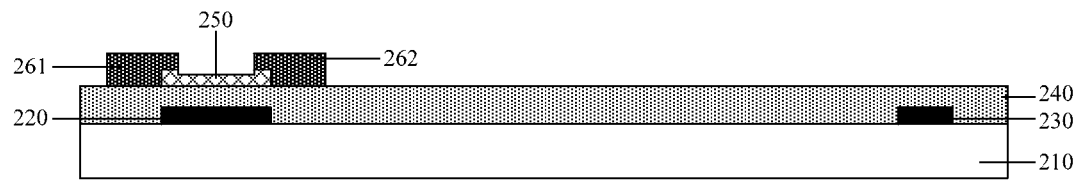
FIG. 2a is a schematic structural view of an array substrate having a TFT formed in a method of manufacturing the array substrate according to an embodiment of the present disclosure.

Step 1, as shown in FIG. 2a, a pattern including a gate line (not shown in the Figures), a gate electrode 220, a common electrode line 230 and a gate insulating layer 240 is formed on a substrate 210, wherein the gate electrode 220, the gate line and the common electrode line 230 are formed in the same pattern process, and which need only one mask process. The gate insulating layer 240 is formed over the gate line, the gate electrode 220 and the common electrode line 230.

Step 2, a pattern including an active layer 250, a data line (not shown in the Figures), a source electrode 261 and a drain electrode 262 is formed. The pattern of the active layer 250, the data line (not shown in the Figures), the source electrode 261 and the drain electrode 262 is formed over the gate insulating layer 240. After this step, a thin film transistor (TFT) is formed by the gate electrode 220, the gate insulating layer 240, the active layer 250, the source electrode 261 and the drain electrode 262; a channel region of the TFT is located between the source electrode 261 and the drain electrode 262. The data line, the source electrode 261 and the drain electrode 262 are formed in a same pattern process.

Figure 2B:
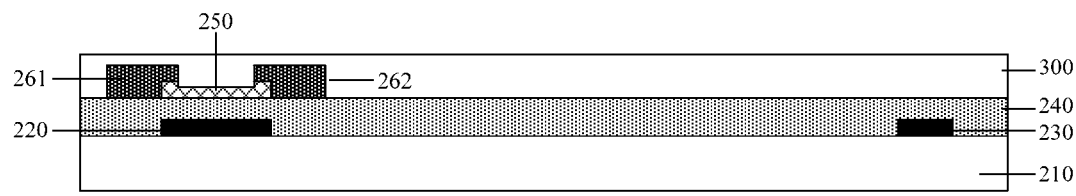

Step 3, as shown in FIG. 2b, an insulating interlayer 300 is formed over the pattern of the source electrode 261, the drain electrode 262 and the active layer 250, wherein the insulating interlayer 300 can be formed by depositing, sputtering or coating process. Since the insulating interlayer 300 is intended to prevent the residues affecting the channel when a first transparent electrode is formed, the insulating interlayer 300 can only cover the region where the TFT is located, or can cover the whole surface of the substrate, and thereby cover the channel of the TFT and protect the channel in subsequent procedures. For example, the insulating interlayer 300 can be made of silicon nitride, and the insulating interlayer may have a thickness of 50 Å-500 Å. Such a thickness can protect the channel of the TFT, and can allow the whole array substrate not to be too thick to keep the thinness of the display device.

Step 4, a pattern including the first transparent electrode is formed over the insulating interlayer 300. In one example of an embodiment of the present disclosure, the first transparent electrode is connected with the drain electrode of the thin film transistor through a first via hole, that is, the first transparent electrode is illustrated as a pixel electrode, as an example.

Figure 2C:
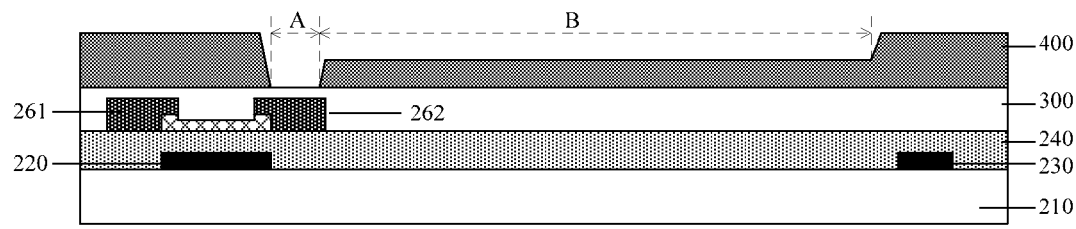
FIG. 2c is a schematic structural view of the substrate having photoresist and being exposed and developed on the basis of FIG. 2b.

As shown in FIG. 2c, photoresist 400 is applied on the insulating interlayer 300. The photoresist 400 is exposed and developed by using double-tone mask (half tone mask or grey tone mask) to remove a portion of the photoresist of the region A corresponding to the drain electrode 262 of the thin film transistor, and partially remain a portion of the photoresist of the region B corresponding to the first transparent electrode, fully remain portions of the photoresist of other regions; that is, the portion of the photoresist of the region B corresponding to the first transparent electrode has a thickness less than the portions of the photoresist of the other regions.

Figure 2D:
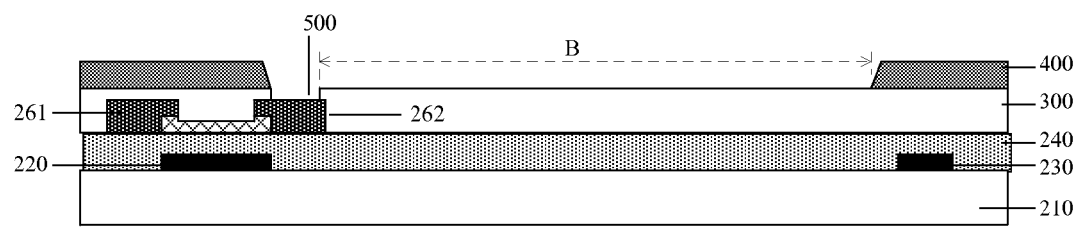
FIG. 2d is a schematic structural view of the substrate having a first via hole formed in the insulating interlayer and of which the photoresist being ash processed on the basis of FIG. 2c.

As shown in FIG. 2d, the exposed insulating interlayer 300 (i.e. the insulating interlayer 300 corresponding to the region A) is etched to form a first via hole 500 so as to expose the drain electrode 262 of the thin film transistor; the photoresist 400 is treated in an ash process to remove a portion of the photoresist of the region B corresponding to the first transparent electrode, and remain portions of the photoresist outside regions where the first transparent electrode and the first via hole are located.

Figure 2E:
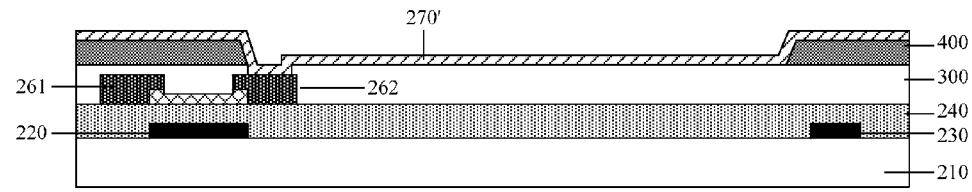
FIG. 2e is a schematic structural view of the substrate having a first transparent conducting thin film on the basis of FIG. 2d.

As shown in FIG. 2e, a first transparent conducting thin film 270' is formed.

Figure 2F:
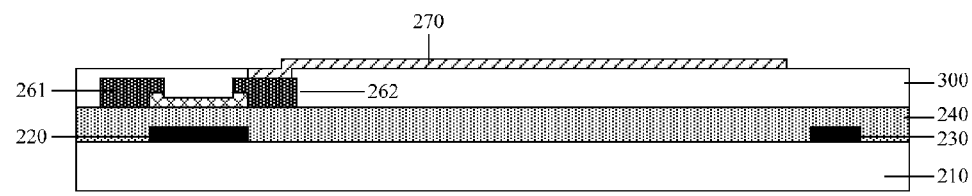
FIG. 2f is a schematic structural view of the substrate having a first transparent electrode on the basis of FIG. 2e.

As shown in FIG. 2f, the remained portions of the photoresist 400 and the first transparent conducting thin film 270' thereon are removed by using a lift off technique to form a first transparent electrode 270. The first transparent electrode 270 is connected with the drain electrode 262 of the thin film transistor through the first via hole 500.

Figure 2G:
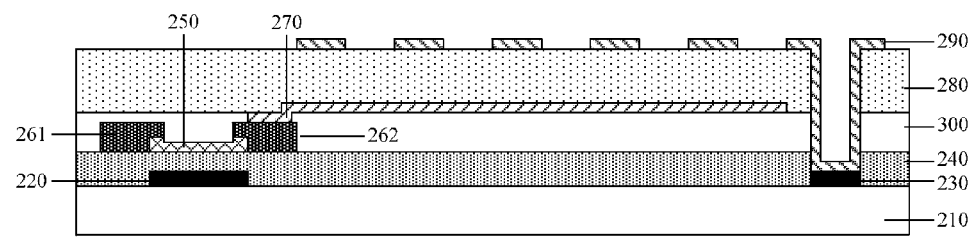
FIG. 2g is a schematic structural view of an array substrate manufactured by using a method of manufacturing an array substrate according to one embodiment of the present disclosure.

Step 5, as shown in FIG. 2g, a pattern including a passivation layer 280 is formed over the first transparent electrode 270.

Step 6, a pattern including a second transparent electrode is formed over the passivation layer. Since the first transparent electrode is a pixel electrode in above example, this second electrode is a common electrode. The method of forming the second electrode is described as follows.

As shown in FIG. 2g, a second via hole is formed in the region corresponding to a common electrode line 230 and a second transparent electrode 290 is formed over the passivation layer 280. The second transparent electrode 290 is connected with the common electrode line 230 through the second via hole.

In the embodiment, the insulating interlayer 300 is formed on the region corresponding to the TFT before the first transparent electrode is formed so that the channel of the TFT is not polluted by the ITO material of the first transparent electrode, thereby to avoid the property of the TFT being degraded and ensure product quality. Additionally, when the first via hole 500 of the insulating interlayer 300 and the first transparent electrode 270 are formed, a double-tone mask exposure process and a lift off process are used to avoid the channel of the TFT being polluted by the ITO material of the first transparent electrode without increasing masks.

Since there is the insulating interlayer 300 between the first transparent electrode 270 and the TFT in the embodiment, the ITO will not be reduced by the hydrogen plasma processing. Therefore, for decreasing $I_{off}$ of the TFT and improving product quality, the method includes a further step between step 2 and step 3: the channel of the TFT is processed by $H_2$ Plasma process.

In above embodiment, the first transparent electrode 270 is a pixel electrode, and the second transparent electrode 290 is a common electrode.

Figure 3:
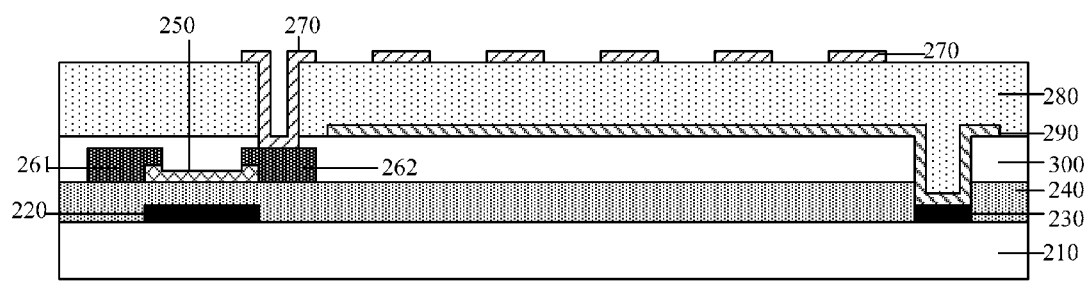
FIG. 3 is a schematic structural view of another array substrate manufactured by using a method of manufacturing an array substrate according to another embodiment of the present disclosure.

According to another embodiment of the present disclosure, the first transparent electrode 270 can be a common electrode, and the second transparent electrode 290 can be a pixel electrode. In the embodiment, the structural view of the formed TFT array substrate is illustrated in FIG. 3, and its manufacturing procedures further include the following steps 4-6 in addition to steps 1-3 corresponding to steps 1-3 of embodiment one.

Step 4, a photoresist is formed on the insulating interlayer 300; the photoresist is exposed and developed by using a double-tone mask to remove a portion of the photoresist of the region corresponding to the common electrode line, partially remain a portion of the photoresist of the region corresponding to the first transparent electrode, fully remain portions of the photoresist of other regions; the exposed insulating interlayer is etched to form the first via hole so as to expose the common electrode line; the photoresist is processed by an ash process to remove a portion of the photoresist of the region corresponding to the first transparent electrode, and remain portions of the photoresist outside regions where the first transparent electrode and the first via hole are located; a first transparent conducting thin film is formed, and the remained portions of the photoresist and the first transparent conducting thin film thereon are removed by using a lift off technique to form the first transparent electrode; and the first transparent electrode is connected with the common electrode line through the first via hole.

Step 5, a passivation layer is formed over the first transparent electrode.

Step 6, a second via hole is formed in a region corresponding to a drain electrode of a thin film transistor over the passivation layer; a second transparent electrode is formed so that the second transparent electrode is connected with the drain electrode through the second via hole.

The manufacturing procedure is similar to that of manufacturing the first transparent electrode 270 as a pixel electrode and manufacturing the second transparent electrode 290 as a common electrode, which is not repeated herein.

The above embodiment takes a bottom gate type of TFT as an example to illustrate the method, but it is also suitable to a top gate type of TFT, which only needs to add an insulating interlayer between the active layer and the first transparent electrode (ITO) of the TFT when the ITO is formed.

The third embodiment of the present disclosure provides a method of manufacturing an array substrate, as shown in FIGS. 4a-4h. The method of manufacturing the array substrate according to the embodiment includes the following steps.

Figure 4A:
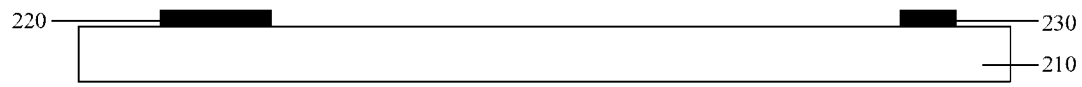
FIG. 4a-4h are schematic structural views of yet another array substrate manufactured by using a method of manufacturing an array substrate according to the third embodiment of the present disclosure.

Step 1, referring to FIG. 4a, a gate mask pattern process is performed on a substrate 210 to form a gate metal layer; a pattern including a gate line (not shown in the Figures), a gate electrode 220 and a common electrode line 230 is formed by using one pattern process and one mask.

Figure 4B:
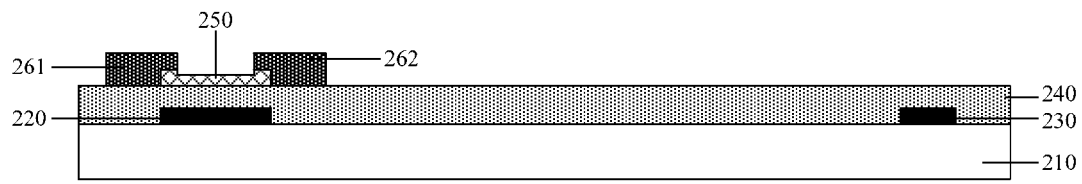

Step 2, referring to FIG. 4b, a source and drain mask pattern process is performed to form a pattern including a gate insulating layer 240, an active layer 250, an ohmic contact layer (e.g. N+a-Si) and a source electrode 261 and a drain electrode 262. The pattern of the active layer 250, a date line, the source electrode 261 and the drain electrode 262 is formed over the gate insulating layer 240. After the step, the gate electrode 220, the gate insulating layer 240, the active layer 250, the source electrode 261 and the drain electrode 262 form a thin film transistor (TFT), wherein a channel region of the TFT is located between the source electrode 261 and the drain electrode 262. The data line, the source electrode 261 and the drain electrode 262 are formed in a same pattern process.

Figure 4C:
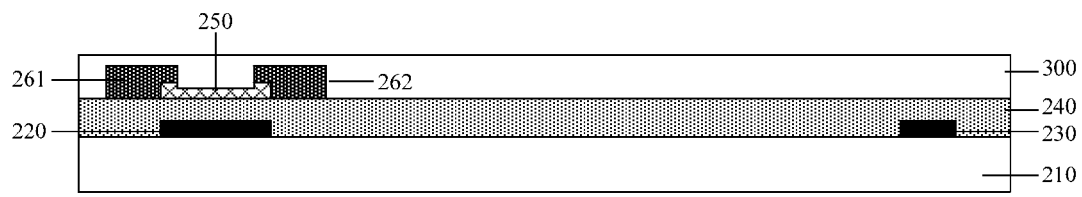

Step 3, referring to FIGS. 4b-4c, a hydrogen plasma process is performed to process the channel of TFT; then a gate insulating interlayer 300 is formed over the pattern of the source electrode 261, the drain electrode 262 and the active layer 250. The insulating interlayer 300 can be formed by depositing, sputtering or coating process, and the insulating interlayer 300 is made of silicon nitride ($SiN_x$). It has a thickness of 50 Å-500 Å.

Figure 4D:
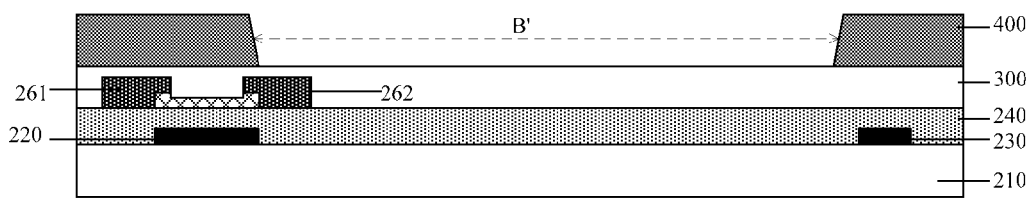

Step 4, referring to FIG. 4d, a photoresist 400 is applied on the insulating interlayer 300. The photoresist 400 is exposed and developed by using a normal exposure process to remove a portion of the photoresist 400 of region B' corresponding to the common electrode region and a part of the drain electrode region of the active layer, and fully remain portions of the photoresist of other regions.

Figure 4E:
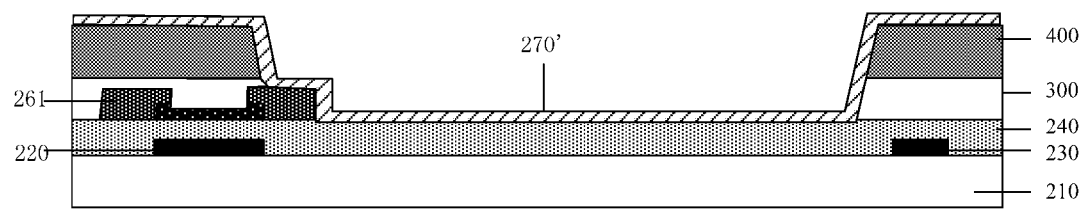

Step 5, referring to FIGS. 4d-4e, the exposed SiNx layer is etched by using a dry etching process to remove silicon nitride insulating interlayer of the region B'.

Figure 4F:
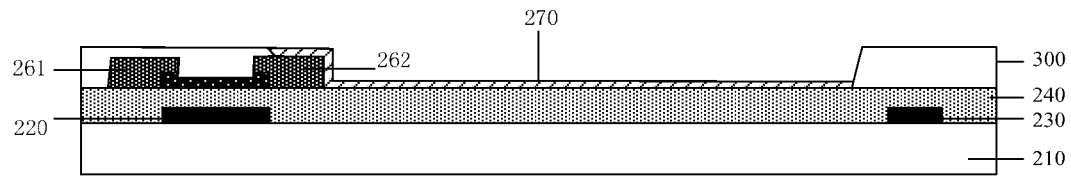

Step 6, referring to FIGS. 4e-4f, a first transparent conducting thin film 270' is deposited on each component undergone step 5, the remained portions of the photoresist 400 and the first transparent conducting thin film 270' thereon are removed by using a lift off technique to form a first transparent electrode 270 on a part of the drain electrode and the gate insulating layer. The first transparent electrode 270 is connected with the drain electrode 262 directly.

Figure 4G:
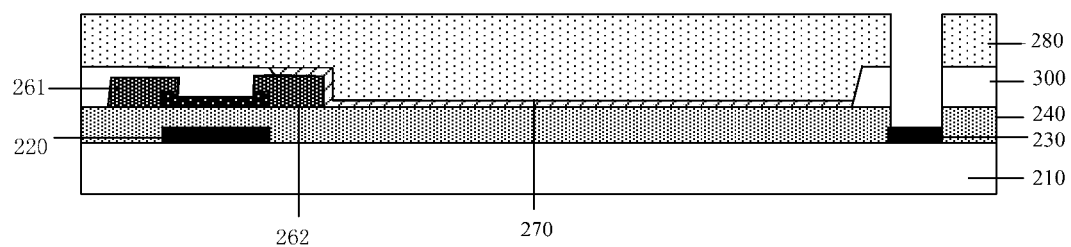

Step 7, referring to FIG. 4g, a passivation layer is formed over each component undergone step 6, and a via hole is formed in a region of the passivation layer and the insulating interlayer 300, corresponding to the common electrode 230.

Figure 4H:
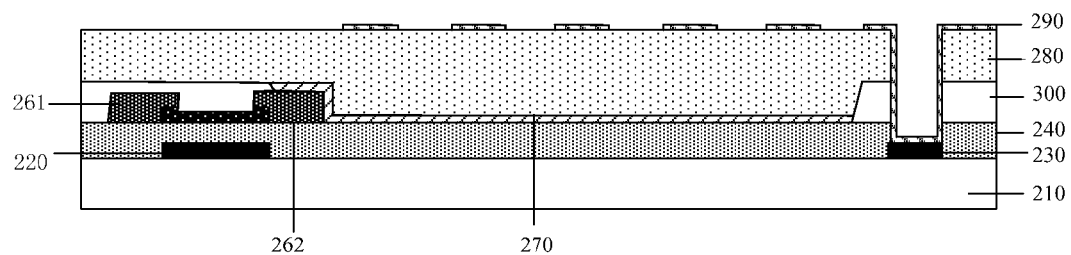

Step 8, referring to FIG. 4h, a second transparent electrode 290 is formed by using a mask pattern process, and the second transparent electrode 290 is connected with the common electrode through the via hole.

Similar to the above first embodiment and second embodiment, in the fourth embodiment of the present disclosure, it is also conceivable that the first transparent electrode of the above third embodiment is configured as a common electrode, and the second transparent electrode is configured as a pixel electrode. Therefore, the formed TFT array substrate and manufacturing method thereof can be contemplated by varying the third embodiment.

The above method of manufacturing the array substrate according to embodiments of the present disclosure solve the contradiction between the hydrogen plasma processing and the haze mura without addition of a process step. It can keep the hydrogen plasma process and decrease $I_{off}$ of the TFT, so that it can avoid the defect that the first transparent electrode (ITO) is reduced due to the hydrogen plasma processing and haze mura.

The embodiments of the present disclosure also provides an array substrate manufactured by using the above method, the array substrate includes a gate line, a data line, a common electrode line, a thin film transistor a first transparent electrode formed on a substrate; a passivation layer and a second transparent electrode formed over the first transparent electrode. For preventing the first transparent electrode polluting the channel of TFT, the array substrate further includes an insulating interlayer located between the active layer of the thin film transistor and the first transparent electrode; a via hole is formed, which passes through the insulating interlayer and the passivation layer; wherein the first transparent electrode is connected with the drain electrode of the thin film transistor, the second transparent electrode is connected with the common electrode through the via hole.

The embodiments of the present disclosure further provides an array substrate manufactured by using the above method, the array substrate includes a gate line, a data line, a common electrode line, a thin film transistor, a first transparent electrode formed on a substrate; a passivation layer and a second transparent electrode formed over the first transparent electrode. For preventing the first transparent electrode polluting a channel of TFT, the array substrate further includes an insulating interlayer located between the active layer of the thin film transistor and the first transparent electrode; a first via hole is formed in the insulating interlayer, a second via hole is formed in the passivation layer.

The first transparent electrode is connected with the drain electrode of the thin film transistor through the first via hole, the second transparent electrode is connected with the common electrode line through the second via hole; or the first transparent electrode is connected with the common electrode line through the first via hole, and the second transparent electrode is connected with the drain electrode of the thin film transistor through the second via hole. So, it can efficiently prevent the first transparent electrode (ITO) process polluting the channel of TFT and degrading the property of TFT, thereby it can improve product quality.

For example, the insulating interlayer is made of silicon nitride, and the insulating interlayer has a thickness of 50 Å-500 Å.

The embodiments of the present disclosure also provide a display device, the display device includes any one of the array substrates. The display device can be any products or components with display functions, such as liquid crystal display panel, electronic paper, liquid crystal display television, liquid crystal display, digital photo frame, mobile phone, tablet computer.

The method of manufacturing the array substrate according to embodiments of the present disclosure can efficiently prevent the first transparent electrode (ITO) process polluting the channel of TFT and degrading the property of TFT, thereby it can improve product quality.

It is understood that the described above are only illustrative embodiments and implementations for explaining the present invention, and the present invention is not intended to limited thereto. For one of ordinary skill in the art, variations and modifications can be made without departing from the spirit and scope of the present invention, and all of such variations and modifications as well as equivalent technical solutions shall fall within the protection scope of the present disclosure. The scope protected by the present invention is defined by the claims.

The present disclosure claims priority of Chinese patent application No. 201410126538.7 filed on Mar. 31, 2014 titled "Array Substrate and Manufacturing Method thereof, Display Device", the entire contents of which are incorporated herein by reference.

What is claimed is:

1. A method of manufacturing an array substrate, comprising:
    forming a pattern including a gate electrode, a gate line, a common electrode line and a gate insulating layer on a substrate;
    forming a pattern including a data line, a source electrode, a drain electrode and an active layer;
    forming a pattern including an insulating interlayer over the pattern of the source electrode, the drain electrode and the active layer;
    forming a pattern including a first transparent electrode, and a first via hole through at least the insulating interlayer to allow the first transparent electrode to be connected with the common electrode line;
    forming a pattern including a passivation layer over the first transparent electrode; and
    then, forming a pattern including a second transparent electrode, and a second via hole through the passivation layer to allow the second transparent electrode to be connected with the drain electrode.

2. The method of manufacturing the array substrate according to claim 1, further comprising:
    applying photoresist on the insulating interlayer;
    exposing and developing the photoresist by using a double-tone mask to remove a portion of the photoresist corresponding to a region where the pattern of the common electrode line is located, partially remain a portion of the photoresist corresponding to a region where the pattern of the first transparent electrode is located, and fully remain portions of the photoresist of other regions;
    etching exposed insulating interlayer to form the first via hole so as to expose the common electrode line;
    processing the photoresist by an ash process to remove a portion of the photoresist corresponding to the region where the pattern of the first transparent electrode is located, and remain portions of the photoresist outside of the regions where the first transparent electrode and the first via hole are located; and
    forming a first transparent conducting thin film and removing the remained portions of the photoresist and the first transparent conducting thin film thereon to form the first transparent electrode.

3. The method of manufacturing the array substrate according to claim 2, further comprising:
    forming the second via hole in a region, corresponding to the drain electrode, of the passivation layer.

4. The method of manufacturing the array substrate according to claim 1, further comprising:
    performing a hydrogen plasma process to a channel region formed between the source electrode and the drain electrode before forming the pattern including the insulating interlayer over the pattern of the source electrode, the drain electrode and the active layer.

5. The method of manufacturing the array substrate according to claim 2, further comprising: performing a hydrogen plasma process to a channel region formed between the source electrode and the drain electrode before forming the pattern including the insulating interlayer over the pattern of the source electrode, the drain electrode and the active layer.

6. The method of manufacturing the array substrate according to claim 1, wherein the insulating interlayer has a thickness of 50 Å-500 Å.

* * * * *